United States Patent
Sagisaka et al.

(10) Patent No.: US 7,855,588 B2
(45) Date of Patent: Dec. 21, 2010

(54) CLOCK SIGNAL GENERATION APPARATUS

(75) Inventors: Masahiko Sagisaka, Kyoto (JP); Hisashi Adachi, Osaka (JP); Taiji Akizuki, Miyagi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/471,757

(22) Filed: May 26, 2009

(65) Prior Publication Data

US 2009/0302918 A1    Dec. 10, 2009

(30) Foreign Application Priority Data

Jun. 9, 2008  (JP) ............... 2008-150592

(51) Int. Cl.
  *H03K 5/13* (2006.01)
(52) U.S. Cl. ...................... 327/239; 327/259
(58) Field of Classification Search .............. None
  See application file for complete search history.

(56) References Cited

U.S. PATENT DOCUMENTS

| | | | | |
|---|---|---|---|---|
| 5,867,453 A | * | 2/1999 | Wang et al. | 368/120 |
| 5,926,053 A | * | 7/1999 | McDermott et al. | 327/298 |
| 6,710,637 B1 | * | 3/2004 | Chan | 327/259 |
| 6,798,248 B2 | * | 9/2004 | Hazucha et al. | 326/93 |
| 6,900,682 B2 | | 5/2005 | Truong et al. | |
| 7,002,418 B2 | | 2/2006 | Zhu et al. | |
| 7,459,952 B2 | * | 12/2008 | Ogita | 327/239 |
| 7,642,832 B2 | * | 1/2010 | Truong et al. | 327/259 |
| 7,649,957 B2 | * | 1/2010 | Garrity et al. | 375/280 |
| 2006/0261903 A1 | | 11/2006 | Watanabe et al. | |
| 2007/0103221 A1 | | 5/2007 | Ogita | |

FOREIGN PATENT DOCUMENTS

JP    2002-108492 A    4/2002

* cited by examiner

*Primary Examiner*—Cassandra Cox
(74) *Attorney, Agent, or Firm*—RatnerPrestia

(57) ABSTRACT

A clock signal generation apparatus containing variable delay devices for varying the delay time of two-phase clock signals used in a load circuit that uses non-overlap clock signals; a non-overlap detector for detecting a non-overlap time in the H-level zones of the two-phase clock signals and outputting a detection signal corresponding to the non-overlap time; and a control signal generation section for generating a control signal that is used to control the variable delay devices on the basis of the detection signal from the non-overlap detector, and capable of securely generating the two-phase clock signals having an optimal non-overlap time while absorbing fluctuations due to temperature characteristics, power supply voltage characteristics and individual differences in components.

18 Claims, 10 Drawing Sheets

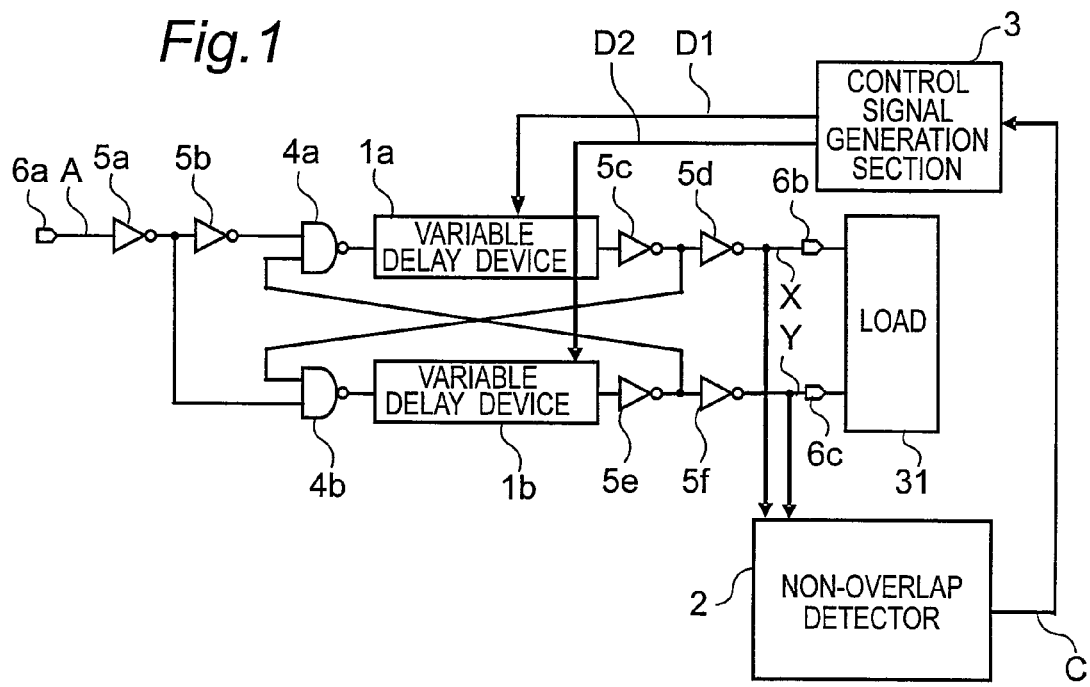
Fig.1
Fig.2A  A
Fig.2B  X
Fig.2C  Y
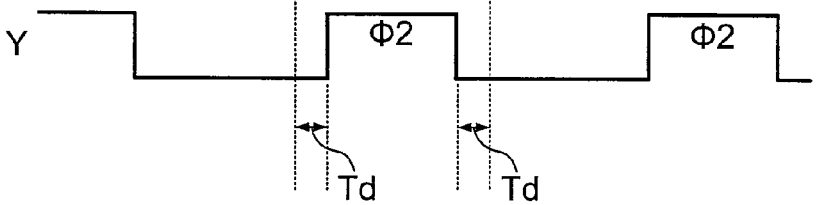
Fig.2D  B
Fig.2E  C
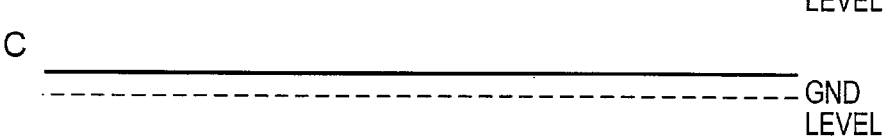

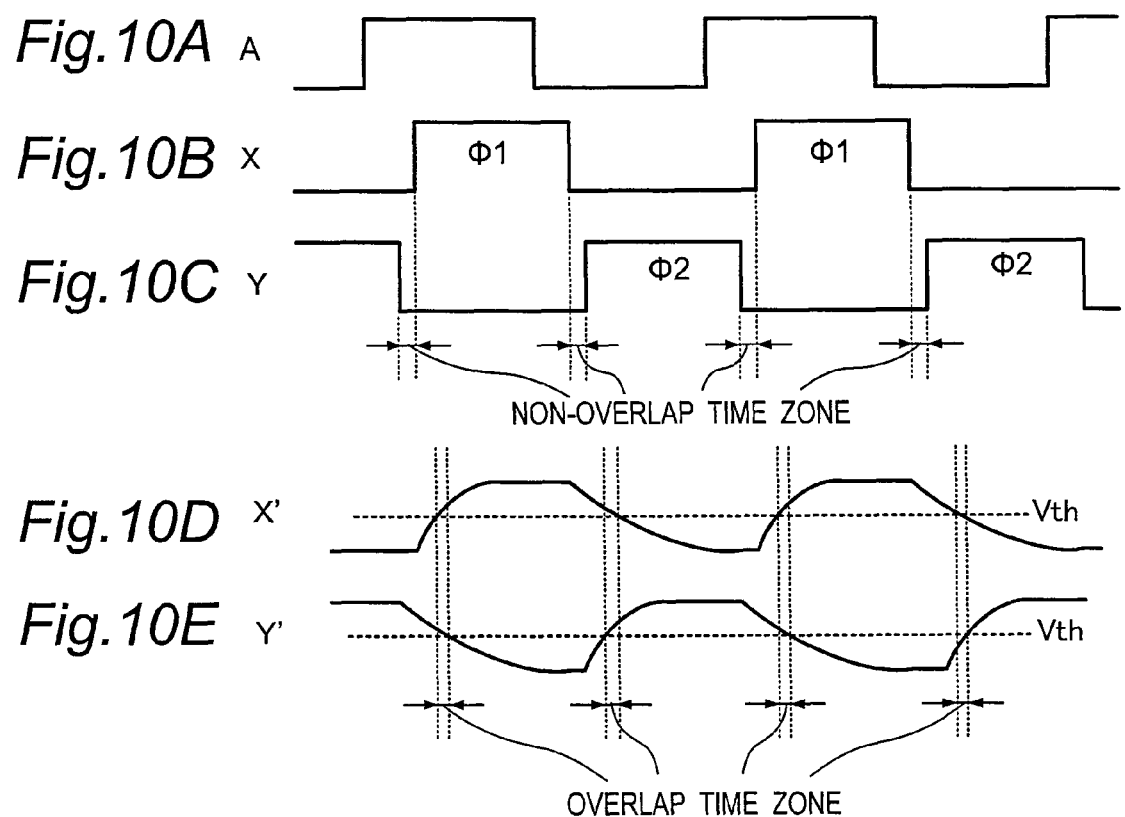

NON-OVERLAP TIME

CLOCK SIGNAL GENERATION APPARATUS

BACKGROUND OF THE INVENTION

The present invention relates to a clock signal generation apparatus for use in discrete-time analog circuits, etc., such as an A/D converter.

In recent years, as data transfer speed becomes higher due to broadbandization in communication system, a discrete-time (hereafter simply referred to as DT) analog circuit typified by a delta-sigma A/D converter is requested to operate at higher speed. Because of this request for higher speed, the operation timing of a clock signal has become very severe. FIG. 11A shows an example of a switched-capacitor (hereafter simply referred to as SC) integrator serving as a typical circuit component for use in a DT delta-sigma A/D converter and the like. This SC integrator contains a switch (hereafter simply referred to as SW) 41a that is turned ON/OFF by a control signal having clock timing Φ1; a switch 41b that is turned ON/OFF by a control signal having clock timing Φ2; capacitors 42a and 42b; and an operational amplifier 40.

FIG. 11B shows the clock timings Φ1 and Φ2. The SW 41a becomes ON in a zone in which the clock timing Φ1 has H level, and the signal input to the input terminal 43a of the integrator charges the capacitor 42a. At this time, the SW 41b is OFF. Next, when the clock timing Φ1 becomes L level, the SW 41a is turned OFF, and the charging of the capacitor 42a is completed.

Next, the SW 41b becomes ON in a zone in which the clock timing Φ2 has H level, and the charge stored in the capacitor 42a is transferred to the capacitor 42b. As a result, a signal obtained by integrating the input signal is output from the output terminal 43b of the integrator. However, if the clock timing Φ2 becomes H level before the clock timing Φ1 becomes L level at this time, the input signal input to the input terminal 43a of the integrator charges not only the capacitor 42a that is intended to be charged by the input signal but also the capacitor 42b simultaneously. If the H level of the clock timing Φ1 overlaps with the H level of the clock timing Φ2 as described above, the SC integrator does not operate properly as an integrator. Hence, it is necessary to use non-overlap clock signals having a non-overlap time in which the clock timings Φ1 and Φ2 become L level simultaneously as shown in FIG. 11B so that the clock timings Φ1 and Φ2 do not become H level simultaneously.

Generally speaking, since the timing of the above-mentioned non-overlap time is generated using a delay element or the like, the timing varies significantly due to the effect of power supply voltage fluctuations and temperature fluctuations. In some cases, the non-overlap zone may be lost, or the non-overlap zone may become too long and the H-level zones of the clock timings Φ1 and Φ2 may become short. In the case that the non-overlap zone is lost, there occurs a problem that the SC integrator malfunctions as described above. Furthermore, in the case that the H-level zones of the clock timings Φ1 and Φ2 become short, since the charging of the capacitor 42a using the input signal is performed in the H-level zone of the clock timing Φ1 and the integration is performed in the H-level zone of the clock timing Φ2, the circuit components including the operational amplifier 40 are required to be operated at higher speed because the H-level zones are short. Hence, the conventional SC integrator has a problem of causing increase in the power consumption and the area of the circuit. Consequently, in a DT analog circuit, such as the SC delta-sigma A/D converter, it is important to generate optimal non-overlap clock signals, i.e., clock signals in which a non-overlap time is obtained securely and the H-level zones of the clock timings are as long as possible.

FIG. 12 is a block diagram showing the configuration of a non-overlap clock signal generator serving as a conventional clock signal generation apparatus disclosed in Japanese Patent Application Laid-open Publication No. 2002-108492.

Next, this conventional non-overlap clock signal generator will be described briefly below referring to the block diagram of FIG. 12.

The two-phase clock signal generation apparatus 101 shown in FIG. 12 contains a machine clock signal output section 102; a control circuit section 103 composed of a CPU; a storage circuit section 105 in which adjustment data for adjusting the non-overlap time of two-phase clock signals is stored; and a two-phase clock signal generation section 104 for generating the two-phase clock signals.

The control circuit section 103 reads appropriate data from the storage circuit section 105 in which adjustment data for adjusting the non-overlap time of the two-phase clock signals is stored and then outputs setting data to the two-phase clock signal generation section 104, depending on the sensor signals output from the temperature sensor 106 and the voltage sensor 107 for detecting operation environment. The two-phase clock signal generation section 104 is configured so that the overlap time between the A-phase clock signal and the B-phase clock signal thereof can be set variably on the basis of the setting data supplied from the control circuit section 103. In the two-phase clock signal generation apparatus 101 configured as described above, the non-overlap time is adjusted.

FIG. 13A is a circuit diagram showing the configuration of the two-phase clock signal generation section 104 in the two-phase clock signal generation apparatus 101 shown in FIG. 12, partly shown in block shape. As shown in FIG. 13A, in the two-phase clock signal generation section 104, the machine clock signal MCK output from the machine clock signal output section 102 is converted into a signal IMCK using an inverter gate 108 and the input to one of the input terminals of a first OR gate 109. Furthermore, the machine clock signal MCK is directly input to one of the input terminals of a second OR gate 110.

The output signal (OR1) of the first OR gate 109 is output as the B-phase clock signal via an inverter gate 111. In addition, the B-phase clock signal is converted into a delayed B-phase clock signal (B-d) that is delayed using a second delay control section (delay circuit section) 112b and input to the other input terminal of the second OR gate 110. On the other hand, the output signal (OR2) of the second OR gate 110 is output as the A-phase clock signal via an inverter gate 113. Furthermore, the A-phase clock signal is converted into a delayed A-phase clock signal (A-d) that is delayed using a first delay control section (delay circuit section) 112a and input to the other input terminal of the first OR gate 109.

FIG. 13B is a circuit diagram showing the configuration of the first delay control section 112a, partly shown in block shape. Since the first delay control section 112a and the second delay control section 112b have the same configuration, the configuration of the first delay control section 112a is described below.

In the first delay control section 112a, multi-stage delay buffers 114, each stage formed of two inverter gates 114a and 114b connected in series, are connected in series. In the first delay control section 112a, the propagation delay time in one single delay buffer 114 is used as one unit of the delay time for adjustment. Furthermore, a switch 115 is provided between the input terminal of the first-stage delay buffer 114 and the output terminal of the first delay control section 112a. Moreover, one switch 115 is provided between the output terminal of each of the delay buffers 114 and the output terminal of the first delay control section 112a. The ON/OFF operation of each of the switches 115 is controlled by the output signal of a decoder 116. The decoder 116 decodes the setting data output from the control circuit section 103 and outputs a control signal for turning ON one of the switches 115. As described above, the two-phase clock signal generation section 104 controls the delay values of the first and second delay control sections 112a and 112b on the basis of the setting data output from the control circuit section 103, thereby adjusting the non-overlap time between the A-phase clock signal and the B-phase clock signal.

As described above, in the conventional non-overlap clock signal generator, delay fluctuation amounts due to temperature fluctuations and power supply voltage fluctuations are stored in memory beforehand, and the delay values of the delay control sections are controlled on the basis of the data to adjust the non-overlap time. Hence, in the conventional non-overlap clock signal generator, individual differences in components due to fluctuations during production, etc. cannot be optimized. In particular, a circuit requiring higher speed clock signals is required to be designed so that the non-overlap time thereof has a sufficient margin. Therefore, the design is required to be performed on the assumption that fluctuations occur such that the non-overlap time becomes maximum, that is, the H-level zones of the non-overlap clock signals become minimum. As a result, the conventional non-overlap clock signal generator leads to increase in circuit power consumption. Furthermore, a large-scale system containing a temperature sensor, a power supply voltage sensor, a CPU, etc. is required to be constructed, whereby there is a problem of causing increase in circuit size.

SUMMARY OF THE INVENTION

In consideration of the above-mentioned problems, an object of the present invention is to provide a highly reliable clock signal generation apparatus capable of securely generating two-phase clock signals having an optimal non-overlap time while absorbing fluctuations due to temperature characteristics, power supply voltage characteristics and individual differences in components.

For the purpose of solving the above-mentioned problems and attaining the object of the present invention, a clock signal generation apparatus according to a first aspect of the present invention contains:

variable delay devices for varying the delay time of two-phase clock signals used in a load circuit that uses non-overlap clock signals, a non-overlap detector for detecting a non-overlap time in the H-level zones of the two-phase clock signals and outputting a detection signal corresponding to the non-overlap time, and a control signal generation section for generating a control signal that is used to control the variable delay devices on the basis of the detection signal from the non-overlap detector. The clock signal generation apparatus according to the first aspect configured as described above detects the non-overlap time and controls the variable delay devices depending on the result of the detection. Hence, the clock signal generation apparatus can adjust the non-overlap time to the desired value and can generate two-phase clock signals having an optimal non-overlap time.

As described above, in the clock signal generation apparatus according to the first aspect of the present invention, the two-phase clock signals output from the clock signal generation apparatus are detected, and the delay time of the variable delay devices, for determining the non-overlap time, is controlled depending on the result of the detection of the non-overlap time. Hence, the clock signal generation apparatus according to the first aspect securely prevents timing failure due to the overlap of the H-level zones of the outputs of the clock signal generation apparatus even if not only temperature fluctuations and power supply voltage fluctuations but also fluctuations caused by individual differences in components during production are present. Furthermore, even under conditions in which power supply voltage fluctuations, temperature functions and fluctuations caused by individual differences in components during production are present, the clock signal generation apparatus according to the first aspect of the present invention can prevent the non-overlap time from extending due to the above-mentioned fluctuations, whereby the H-level zones of the non-overlap clock signals can be set as long as possible. Moreover, the clock signal generation apparatus according to the first aspect of the present invention can release the necessity for obtaining high operation speed of a DT analog circuit or the like containing a non-overlap circuit, whereby reduction in power consumption and circuit area can be attained. Still further, the clock signal generation apparatus according to the first aspect is not required to be constructed to a large-scale system containing a CPU, a temperature sensor and/or a voltage sensor, etc. and is thus configured so that it can be made compact.

In a clock signal generation apparatus according to a second aspect of the present invention, the non-overlap detector according to the first aspect may contain a logic circuit for comparing the two-phase clock signals input and an integrator for integrating the output of the logic circuit.

In a clock signal generation apparatus according to a third aspect of the present invention, the control signal generation section according to the first or second aspect may contain a reference voltage generation section for generating a reference signal corresponding to a predetermined non-overlap time; and a comparator for comparing the detection signal from the non-overlap detector with the reference signal and outputting a control signal.

In a clock signal generation apparatus according to a fourth aspect of the present invention, the variable delay devices according to the first to third aspects have a logic element section for determining the non-overlap time in the H-level zones of the two-phase clock signals, and the delay amount of the logic element section is adjusted and the non-overlap time is determined by controlling the power supply voltage or the back-gate voltage of the logic element section using the control signal. The clock signal generation apparatus according to the fourth aspect configured as described above can adjust the delay amount in the logic element section for determining the non-overlap time.

As described referring to FIGS. 13A and 13B in the above-mentioned background technology, in the conventional clock signal generation apparatus, the delay amount of the variable delay device is adjusted by changing the number of stages of unit delay devices, such as inverters, inside the variable delay device. Hence, it is impossible to adjust the delay amount to a delay amount corresponding to a unit delay device or less. The clock signal generation apparatus according to the fourth aspect can finely adjust the delay amount to the delay amount corresponding to a unit delay device or less by controlling the power supply voltage or the back-gate voltage of the logic element section inside the variable delay device using the control signal. Hence, the clock signal generation apparatus according to the fourth aspect can set the H-level zones of the non-overlap clock signals as long as possible in a DT analog circuit or the like that is requested to perform high-speed operation requiring fine adjustment of the delay amount, whereby reduction in power consumption and circuit area can be attained.

In a clock signal generation apparatus according to a fifth aspect of the present invention, the non-overlap detector according to the first to fourth aspects has a detection voltage maintaining circuit for maintaining the detection signal corresponding to the non-overlap time detected, and the control signal generation section is configured so as to generate the control signal on the basis of the detection signal maintained in the detection voltage maintaining circuit. The clock signal generation apparatus according to the fifth aspect configured as described above is configured so that it is not necessary to activate the non-overlap detector at all times, and low power consumption can be attained.

In a clock signal generation apparatus according to a sixth aspect of the present invention, the control signal generation section according to the first to fifth aspects has a control voltage maintaining circuit for maintaining the control signal generated, and the variable delay devices change the delay time of the two-phase clock signals depending on the control signal maintained in the control voltage maintaining circuit. The clock signal generation apparatus according to the sixth aspect configured as described above is configured so that it is not necessary to activate the non-overlap detector and the control signal generation section at all times, and low power consumption can be attained.

In a clock signal generation apparatus according to a seventh aspect of the present invention, the control signal generation section according to the first to fifth aspects contains a control logic circuit for digitally comparing the non-overlap time based on the detection signal from the non-overlap detector with a preset predetermined value and generating the desired control signal value on the basis of the result of the comparison; a storage device for storing the desired control signal value generated in the control logic circuit as a digital value; and a D/A converter for converting the desired control signal value into an analog value. The clock signal generation apparatus according to the seventh aspect configured as described above digitally judges whether the non-overlap time is optimal on the basis of the detection signal output from the non-overlap detector and can maintain an optimal control signal value as a digital value in the storage device and can thus attain the maintenance of the optimal control signal value for a long time.

In a clock signal generation apparatus according to an eighth aspect of the present invention, the non-overlap detector according to the first to seventh aspects is disposed inside a load circuit that uses the non-overlap clock signals or directly connected to the input terminals of the load circuit. The clock signal generation apparatus according to the eighth aspect configured as described above can control the non-overlap time to an optimum value in consideration of the effect of parasitic resistances and parasitic capacitances in the wiring and the like to the load circuit that uses the non-overlap clock signals. Hence, the clock signal generation apparatus according to the eighth aspect can prevent overlap of the H-level zones of the two-phase clock signals due to delay in wiring and due to blunt rising and falling edges of the clock signals and can also prevent malfunction of the load circuit that uses the non-overlap clock signals.

The present invention can provide a highly reliable clock signal generation apparatus capable of securely generating two-phase clock signals having an optimal non-overlap time while absorbing fluctuations due to temperature characteristics, power supply voltage characteristics and individual differences in components.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1 is a block diagram showing the configuration of a non-overlap clock signal generator serving as a clock signal generation apparatus according to a first embodiment of the present invention;

FIGS. 2A to 2E are diagrams showing signal waveforms in the non-overlap clock signal generator according to the first embodiment:

FIGS. 10A to 10E are diagrams showing the waveforms of non-overlap clock signals in the non-overlap clock signal generator according to the sixth embodiment;

Figure 3:
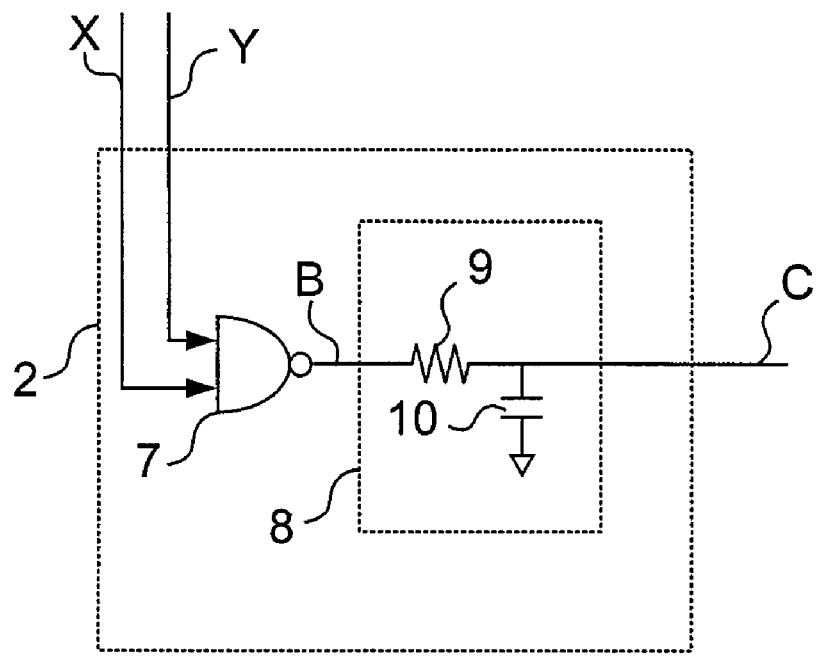
FIG. 3 is a circuit diagram showing an example of the configuration of a non-overlap detector 2 according to the first embodiment.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

First Embodiment

A clock signal generation apparatus according to a first embodiment of the present invention will be described below referring to FIGS. 1 to 4. FIG. 1 is a block diagram showing the configuration of a non-overlap clock signal generator serving as the clock signal generation apparatus according to the first embodiment of the present invention.

As shown in FIG. 1, the non-overlap clock signal generator according to the first embodiment contains variable delay devices 1a and 1b, a non-overlap detector 2, a control signal generation section 3, NAND logic elements 4a and 4b, inverter logic elements 5a, 5b, 5c, 5d, 5e and 5f, a clock signal input terminal 6a, an output terminal 6b for outputting a non-overlap clock signal X having phase Φ1, and an output terminal 6c for outputting a non-overlap clock signal Y having phase Φ2.

FIGS. 2A to 2E show signal waveforms in the non-overlap clock signal generator according to the first embodiment. FIG. 2A shows a clock signal A input to the clock signal input terminal 6a. FIG. 2B shows the non-overlap clock signal X having phase Φ1 and output from the output terminal 6b. FIG. 2C shows the non-overlap clock signal Y having phase Φ2 and output from the output terminal 6c. FIG. 2D shows a signal B generated in the non-overlap detector 2. FIG. 2E shows a detection signal C input from the non-overlap detector 2 to the control signal generation section 3.

The non-overlap clock signal generator according to the first embodiment is configured so as to be able to adjust its non-overlap time using the delay amount Td of the variable delay devices 1a and 1b so that the non-overlap clock signal X and the non-overlap clock signal Y shown in FIGS. 2B and 2C are output. The non-overlap clock signal X having phase Φ1 and output from the output terminal 6b and the non-overlap clock signal Y having phase Φ2 and output from the output terminal 6c are input to a circuit that uses the non-overlap clock signals X and Y, serving as a load circuit 31, such as an A/D converter. Furthermore, the generated non-overlap clock signals X and Y are input to the non-overlap detector 2.

The non-overlap detector 2 is configured so as to detect the non-overlap time, i.e., the non-overlap amount of the non-overlap clock signals X and Y output from the output terminals 6b and 6c. FIG. 3 is a circuit diagram showing an example of the configuration of the non-overlap detector 2. In the first embodiment, the configuration of the non-overlap detector 2 according to the present invention will be described below using the configuration shown in FIG. 3 as an example, although the configuration is not limited to that shown in FIG. 3.

The non-overlap detector 2 shown in FIG. 3 contains NAND logic element 7 and an integrator 8. An integrator containing a resistor 9 and a capacitor 10 is shown in FIG. 3 as an example of the configuration of the integrator 8. In the non-overlap detector 2, the non-overlap clock signals X and Y output from the output terminals 6b and 6c of the non-overlap clock signal generator are input, and the NAND logic element 7 detects a zone in which the two non-overlap clock signals X and Y have L level, i.e., a non-overlap zone, and outputs the signal B (see FIG. 2D) to the integrator 8. The integrator 8 integrates the input signal B and outputs the waveform of the signal C (see FIG. 2E) obtained by averaging the waveform of the signal B with respect to time as the detection signal C of the non-overlap detector 2. Hence, as the H-level zone of the waveform of the signal B is longer, that is, as the non-overlap time is longer, the detection signal C has a voltage closer to the power supply voltage. Furthermore, as the H-level zone of the waveform of the signal B is shorter, that is, as the non-overlap time is shorter, the detection signal C has a voltage closer to the GND voltage (0 V). On the other hand, when the non-overlap time is zero, that is, when the H-level zone of the non-overlap clock signal X having phase Φ1 overlaps with that of the non-overlap clock signal Y having phase Φ2, the non-overlap detector 2 outputs the GND level voltage (0 V) to the control signal generation section 3.

Figure 4:
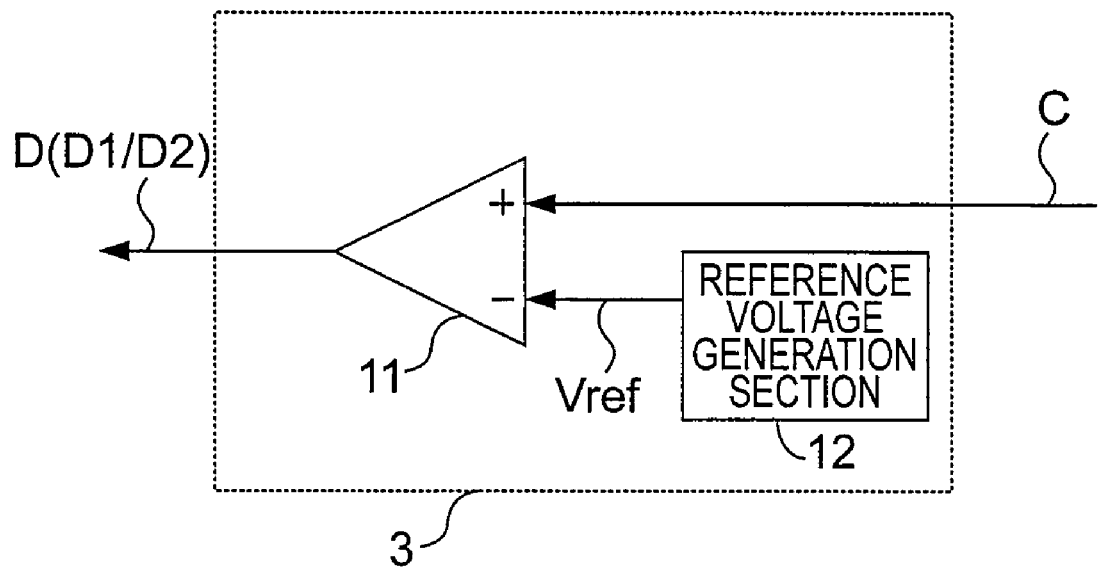
FIG. 4 is a block diagram showing an example of the configuration of a control signal generation section 3 according to the first embodiment.

The control signal generation section 3 is configured so as to output a control signal for controlling the variable delay devices 1a and 1b on the basis of the detection signal C of the non-overlap detector 2. FIG. 4 is a block diagram showing an example of the configuration of the control signal generation section 3. In the first embodiment, the configuration of the control signal generation section 3 according to the present invention will be described below using the configuration shown in FIG. 4 as an example, although the configuration is not limited to that shown in FIG. 4.

The control signal generation section 3 shown in FIG. 4 contains an operational amplifier 11 and a reference voltage generation section 12. The control signal generation section 3 compares the detection signal C from the non-overlap detector 2 with a reference voltage Vref and raises or lowers the voltage of the control signal D (D1 or D2 in FIG. 1) output to the variable delay device 1a or 1b depending on the magnitude correlation between the detection signal C and the reference voltage Vref. In other words, the preset reference voltage Vref corresponds to a non-overlap time setting value serving as a target in the non-overlap clock signal generator. In the control signal generation section 3, the control signal D to be output is changed depending on whether the non-overlap time actually detected using the non-overlap detector 2 is longer or shorter than the setting value. In this way, a closed loop is formed in which the delay amount of the variable delay device 1a or 1b is adjusted using the non-overlap detector 2 and the control signal generation section 3. As a result, an optimal non-overlap time can be maintained at all times regardless of being affected by temperature fluctuations, power supply voltage fluctuations, fluctuations caused by individual differences in components, etc.

In the non-overlap clock signal generator according to the first embodiment, the reference voltage Vref is not required to be a fixed value, but the clock signal generator may be configured so that the reference voltage can be set as desired. In addition, in the first embodiment, although the non-overlap detector 2 and the control signal generation section 3 are described as separate function blocks to facilitate understanding the description, they may be configured so as to be integrated into one function block.

Second Embodiment

Next, a non-overlap clock signal generator serving as a clock signal generation apparatus according to a second embodiment of the present invention will be described below. The basic configuration of the non-overlap clock signal generator according to the second embodiment is the same as the configuration of the non-overlap clock signal generator according to the first embodiment shown in FIG. 1 described above. Hence, in the second embodiment, components having the same functions as those of the first embodiment are designated by the same numerals, and the descriptions in the first embodiment are applied to their descriptions.

Figure 5A:
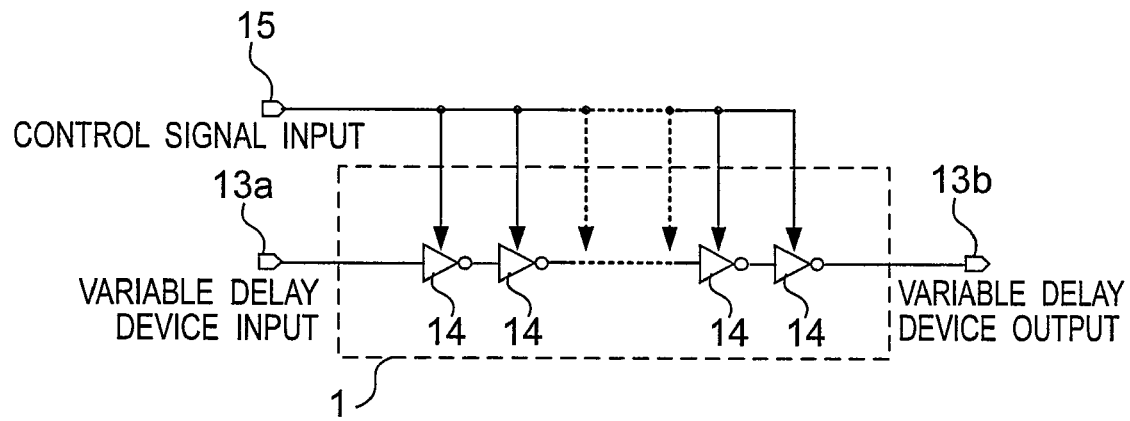
FIG. 5A is a block diagram showing the configuration of a variable delay device 1 according to a second embodiment of the present invention.

In the non-overlap clock signal generator according to the second embodiment, a variable delay device capable of adjusting the delay amount by receiving the control signal from the control signal generation section 3. FIG. 5A is a block diagram showing the configuration of a variable delay device 1 in the non-overlap clock signal generator according to the second embodiment. The variable delay device 1 according to the second embodiment corresponds to each of the variable delay devices 1a and 1b according to the first embodiment.

Figure 5B:
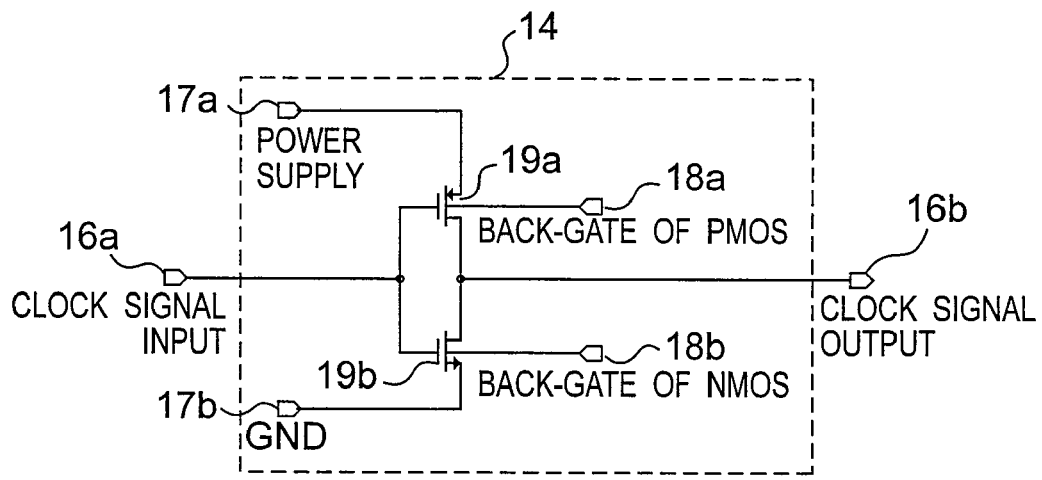
FIG. 5B is a circuit diagram showing the configuration of the logic element 14 of the variable delay device 1 according to the second embodiment.

The variable delay device 1 has one or more logic elements 14 concatenated, a variable delay device input terminal 13a, a variable delay device output terminal 13b, and a control signal input terminal 15. In the second embodiment, although an example in which inverters are used as the logic elements 14 is described, the logic elements 14 are not limited to inverters in the present invention. FIG. 5B is a circuit diagram showing the configuration of the logic element 14. The logic element 14 contains PMOS 19a, an NMOS 19b, a clock signal input terminal 16a, a clock signal output terminal 16b, the power supply terminal 17a of the logic element 14, the GND terminal 17b of the logic element 14, the back-gate terminal 18a of the PMOS 19a, and the back-gate terminal 18b of the NMOS 19b. The logic element 14 is usually used such that the voltage of the power supply terminal 17a is fixed at the power supply voltage, the voltage of the GND terminal 17b is fixed at the GND voltage, the voltage of the PMOS back-gate terminal 18a is fixed at the power supply voltage, and the voltage of the NMOS back-gate terminal 18b is fixed at the GND voltage.

When the voltage difference between the power supply terminal 17a and the GND terminal 17b of the logic element 14 configured as described above increases, the delay amount at the time of the signal transmission from the clock signal input terminal 16a to the clock signal output terminal 16b decreases. Conversely, when the voltage difference between the power supply terminal 17a and the GND terminal 17b increases, the delay amount increases. Through the use of this phenomenon, the delay amount of the logic element 14 can be adjusted by supplying the control signal D, which is output from the control signal generation section 3 and input to the control signal input terminal 15, to either the power supply terminal 17a or the GND terminal 17b of the logic element 14 or both. As a result, the delay amount of the variable delay device 1 can be changed using the control signal D. However, when the voltage at the power supply terminal 17a of the logic element 14 is raised, the delay amount of the logic element 14 decreases, and, on the other hand, when the voltage at the GND terminal 17b of the logic element 14 is raised, the delay amount of the logic element 14 increases. Hence, attention should be paid to the fact that it is necessary to change the polarity of the control signal D of the control signal generation section 3 depending on which voltage is controlled. Furthermore, in the case that the voltage at the power supply terminal 17a and the voltage at the GND terminal 17b of the logic element 14 are controlled simultaneously, control signals D being different in polarity are required. For this purpose, multiple control signals D should only be generated in the control signal generation section 3 and supplied to the variable delay device 1, although this configuration is not shown in FIG. 1.

In addition, when the voltage at the PMOS back-gate terminal 18a of the logic element 14 is raised, the absolute value of the threshold voltage of the PMOS 19a rises and the delay amount increases. When the voltage at the NMOS back-gate terminal 18b is lowered, the absolute value of the threshold voltage of the NMOS 19b rises and the delay amount increases. Through the use of this phenomenon, the delay amount of the logic element 14 can be adjusted by supplying the control signal D, which is output from the control signal generation section 3 and input to the control signal input terminal 15, to either the PMOS back-gate terminal 18a or the NMOS back-gate terminal 18b of the logic element 14 or both. As a result, the delay amount of the variable delay device 1 can be changed using the control signal D. However, when the voltage at the PMOS back-gate terminal 18a of the logic element 14 is raised, the delay amount of the logic element 14 increases, and, on the other hand, when the voltage at the NMOS back-gate terminal 18b of the logic element 14 is raised, the delay amount of the logic element 14 decreases. Hence, attention should be paid to the fact that it is necessary to change the polarity of the control signal D of the control signal generation section 3 depending on which voltage is controlled. Furthermore, in the case that the voltage at the PMOS back-gate terminal 18a and the voltage at the NMOS back-gate terminal 18b of the logic element 14 are controlled simultaneously, control signals D being different in polarity are required. For this purpose, multiple control signals D should only be generated in the control signal generation section 3 and supplied to the variable delay device 1, although this configuration is not shown in FIG. 1.

Figure 13A:
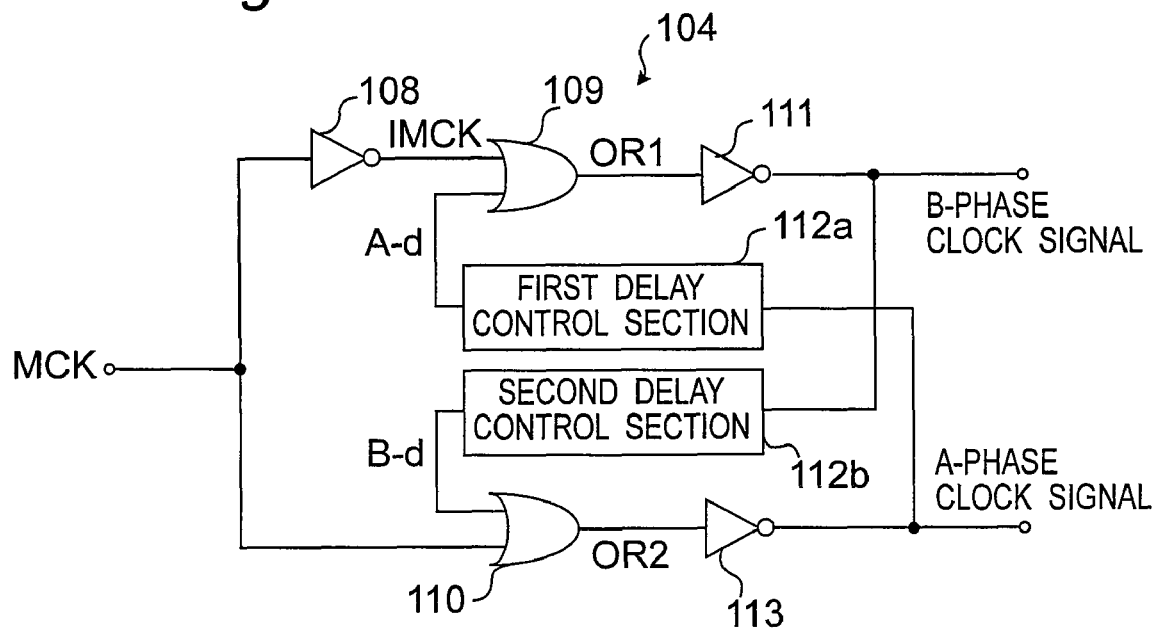
FIG. 13A is a circuit diagram showing the configuration of the two-phase clock signal generation section 104 in the two-phase clock signal generation apparatus 101 shown in FIG. 12, partly shown in block shape.
Figure 13B:
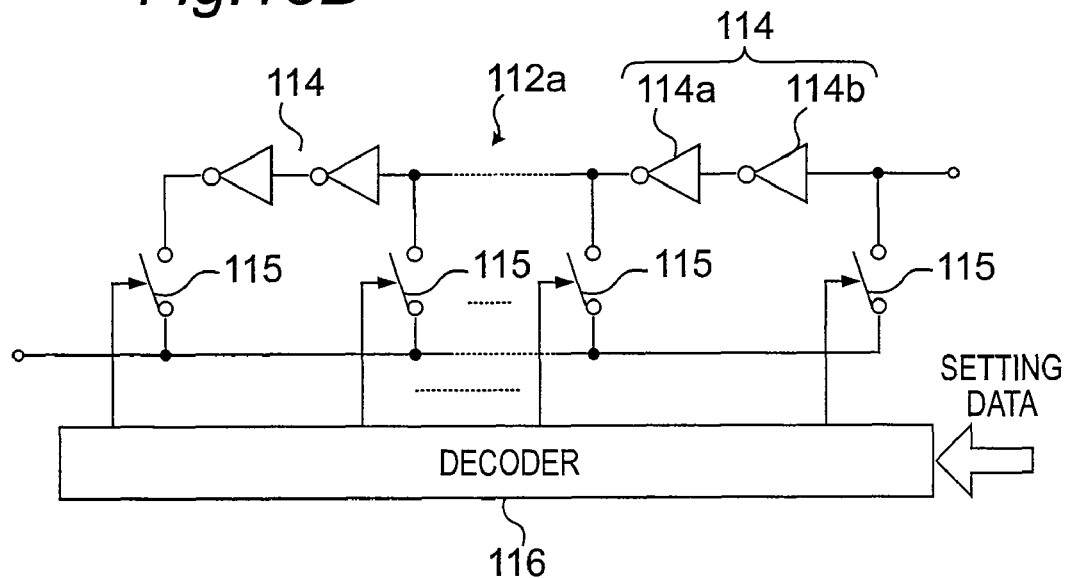
FIG. 13B is a circuit diagram showing the configuration of the first delay control section 112a in the two-phase clock signal generator 104, partly shown in block shape.

In the conventional configuration in which the delay amount is adjusted by switching the number of stages of the inverters as in the case of the conventional non-overlap clock signal generator shown in FIG. 13b described below, it is difficult to adjust the delay amount to a delay amount corresponding to one inverter (approximately several hundred ps) or less. However, in the non-overlap clock signal generator according to the second embodiment, it is possible to adjust the delay amount to a delay amount of approximately 100 ps or less by controlling the power supply voltage and the back-gate voltage of the variable delay device 1. Although FIG. 5A shows that the control signal D is input to all the logic elements 14 inside the variable delay device 1, the control signal is not necessarily input to all the logic elements 14. The number of the logic elements to be controlled may be determined depending on the desired target delay amount.

Third Embodiment

Next, a non-overlap clock signal generator serving as a clock signal generation apparatus according to a third embodiment of the present invention will be described below. Although the basic configuration of the non-overlap clock signal generator according to the third embodiment is the same as the configuration of the non-overlap clock signal generator according to the first embodiment shown in FIG. 1 described above, the configuration is different in the internal configuration of the non-overlap detector thereof. Hence, in the third embodiment, the configuration of the non-overlap detector 2A of the non-overlap clock signal generator will be described in detail, and the descriptions in the first embodiment are applied to the descriptions of the other configurations.

In the non-overlap clock signal generator according to the third embodiment, components having the same functions as those of the first embodiment are designated by the same numerals, and the descriptions in the first embodiment are applied to their descriptions. Furthermore, since the operation of the non-overlap clock signal generator according to the third embodiment is basically the same as the operation of the non-overlap clock signal generators according to the above-mentioned first and second embodiments, the description of the operation is omitted.

Figure 6A:
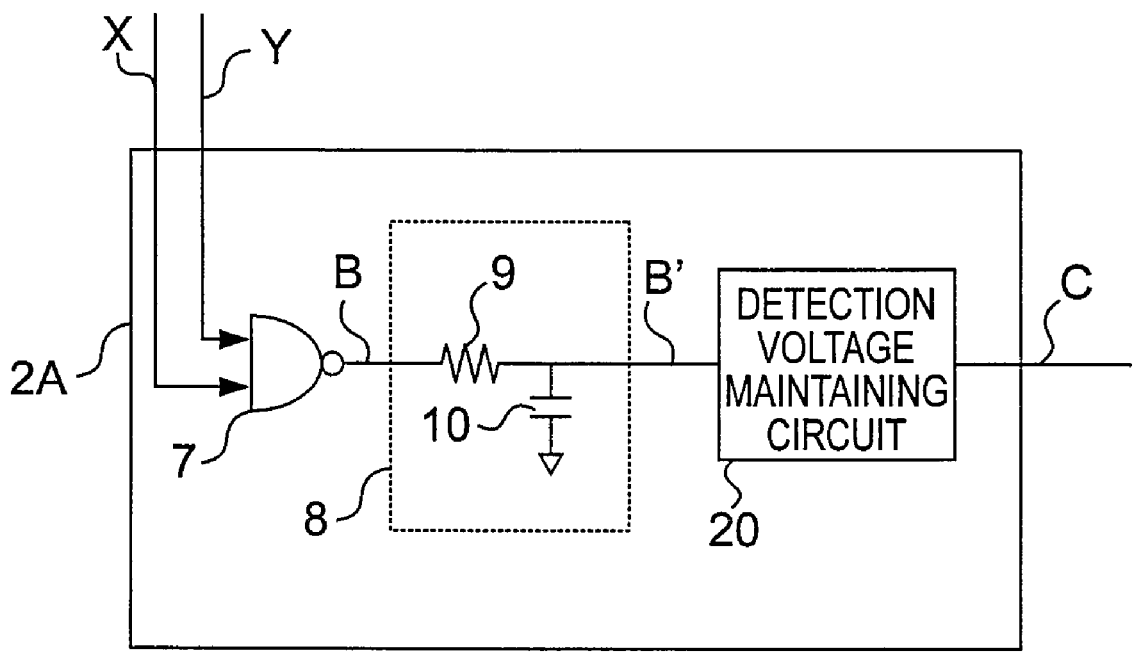
FIG. 6A is a circuit diagram showing the configuration of a non-overlap detector 2A in a non-overlap clock signal generator according to a third embodiment of the present invention, partly shown in block shape.

FIG. 6A is a circuit diagram showing the configuration of the non-overlap detector 2A in the non-overlap clock signal generator according to the third embodiment, partly shown in block shape. The non-overlap detector 2A shown in FIG. 6A is equipped with a detection voltage maintaining circuit 20 that is added to the configuration of the non-overlap detector 2 described referring to FIG. 3 described above.

Figure 6B:
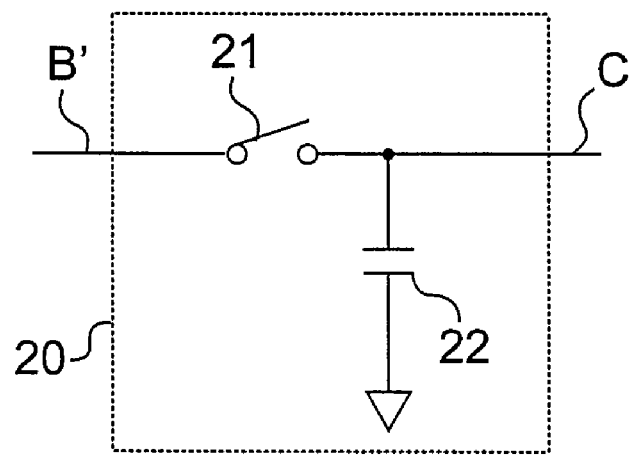
FIG. 6B is a circuit diagram showing an example of the configuration of a detection voltage maintaining circuit 20 in the non-overlap detector 2A.

FIG. 6B is a circuit diagram showing an example of the configuration of the detection voltage maintaining circuit 20. The detection voltage maintaining circuit 20 shown in FIG. 6B contains a switch 21 and a capacitor 22. The detection voltage maintaining circuit 20 shown in FIG. 6B is given as an example and may have another configuration, provided that the circuit has a function capable of temporarily maintaining the voltage input thereto.

In the non-overlap detector 2A shown in FIG. 6A, only when the non-overlap time of the non-overlap clock signals X and Y output from the non-overlap clock signal generator is adjusted, the switch 21 of the detection voltage maintaining circuit 20 is turned ON to activate the non-overlap detector 2A, and the non-overlap amount is adjusted. When the adjustment of the non-overlap amount is completed, the switch 21 is turned OFF, the voltage of the signal B' having been output from the integrator 8 is maintained in the capacitor 22. Then, even if the non-overlap detector 2A is in a stop state, the voltage of the signal B' having been output from the integrator 8 is maintained continuously in the detection voltage maintaining circuit 20. For this reason, it is not necessary to activate the non-overlap detector 2A at all times and low power consumption can be attached by adjusting the non-overlap amount and by maintaining the detection voltage obtained at the time of the adjustment, for example, before a circuit, such as an A/D converter, serving as a load circuit that uses the non-overlap clock signals is activated (for example, when the power is turned ON).

Fourth Embodiment

Next, a non-overlap clock signal generator serving as a clock signal generation apparatus according to a fourth embodiment of the present invention will be described below. Although the basic configuration of the non-overlap clock signal generator according to the fourth embodiment is the same as the configuration of the non-overlap clock signal generator according to the first embodiment shown in FIG. 1 described above, the configuration is different in the internal configuration of the control signal generation section thereof. Hence, in the fourth embodiment, the configuration of the control signal generation section 3A of the non-overlap clock signal generator will be described in detail, and the descriptions in the first embodiment are applied to the descriptions of the other configurations.

In the non-overlap clock signal generator according to the fourth embodiment, components having the same functions as those of the first embodiment are designated by the same numerals, and the descriptions in the first embodiment are applied to their descriptions. Furthermore, since the operation of the non-overlap clock signal generator according to the fourth embodiment is basically the same as the operation of the non-overlap clock signal generators according to the first and second embodiments, the description of the operation is omitted.

Figure 7A:
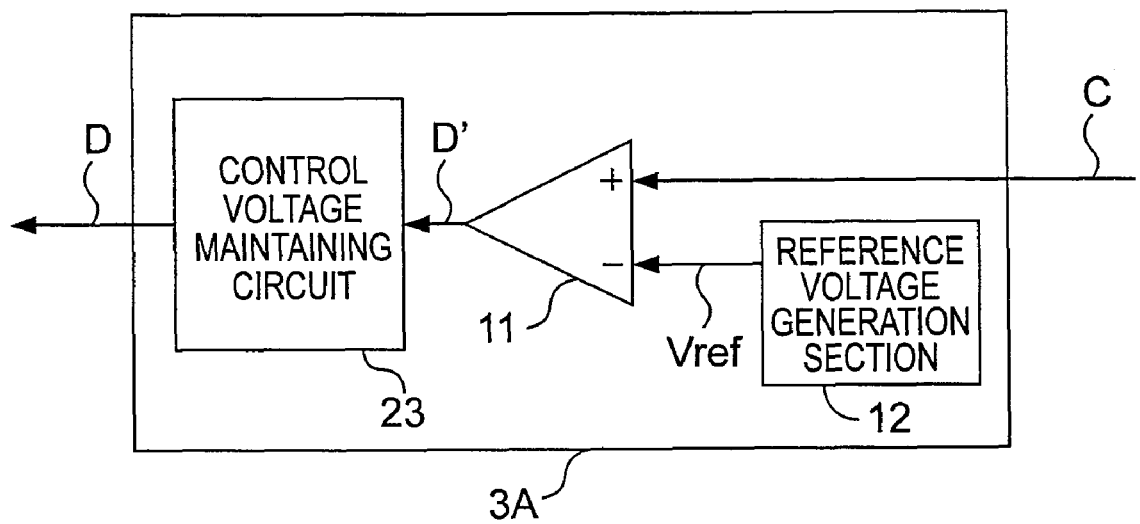
FIG. 7A is a circuit diagram showing the configuration of a control signal generation section 3A in a non-overlap clock signal generator according to a fourth embodiment of the present invention, partly shown in block shape.

FIG. 7A is a circuit diagram showing the configuration of the control signal generation section 3A in the non-overlap clock signal generator according to the fourth embodiment, partly shown in block shape. The control signal generation section 3A shown in FIG. 7A is equipped with a control voltage maintaining circuit 23 that is added to the configuration of the control signal generation section 3 described referring to FIG. 4 described above.

Figure 7B:
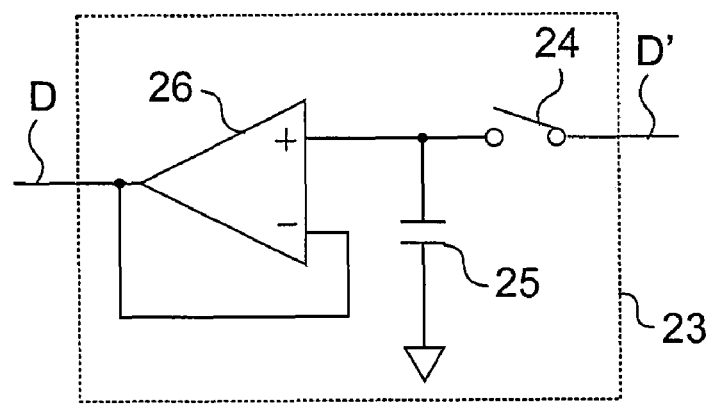
FIG. 7B is a circuit diagram showing an example of the configuration of a control voltage maintaining circuit 23 in the control signal generation section 3A.

FIG. 7B is a circuit diagram showing an example of the configuration of the control voltage maintaining circuit 23. The control voltage maintaining circuit 23 shown in FIG. 7B contains a switch 24, a capacitor 25 and an operational amplifier 26. The control voltage maintaining circuit 23 shown in FIG. 7B is given as an example and may have another configuration, provided that the circuit has a function capable of temporarily maintaining the voltage input thereto.

In the control signal generation section 3A shown in FIG. 7A, only when the non-overlap time, i.e., the non-overlap amount, of the non-overlap clock signals X and Y output from the non-overlap clock signal generator is adjusted, the non-overlap detector 2 and the control signal generation section 3A are activated, the switch 24 is turned ON, and the non-overlap time is adjusted. When the adjustment of the non-overlap time is completed, the switch 21 is turned OFF, the voltage of the signal D' having been output from the operational amplifier 11 is maintained in the capacitor 25. Then, even if the non-overlap detector 2 and the control signal generation section 3A are in a stop state, the voltage of the signal D' having been output from the operational amplifier 11 is maintained continuously in the control voltage maintaining circuit 23. For this reason, it is not necessary to activate the non-overlap detector 2 at all times and low power consumption can be attached by adjusting the non-overlap amount and by maintaining the control signal obtained at the time of the adjustment, for example, before a circuit, such as an A/D converter, serving as a load circuit that uses the non-overlap clock signals is activated (for example, when the power is turned ON).

Fifth Embodiment

Next, a non-overlap clock signal generator serving as a clock signal generation apparatus according to a fifth embodiment of the present invention will be described below. Although the basic configuration of the non-overlap clock signal generator according to the fifth embodiment is the same as the configuration of the non-overlap clock signal generator according to the first embodiment shown in FIG. 1 described above, the configuration is different in the internal configuration of the control signal generation section thereof. Hence, in the fifth embodiment, the configuration of the control signal generation section 3B of the non-overlap clock signal generator will be described in detail, and the descriptions in the first embodiment are applied to the descriptions of the other configurations.

In the non-overlap clock signal generator according to the fifth embodiment, components having the same functions as those of the first embodiment are designated by the same numerals, and the descriptions in the first embodiment are applied to their descriptions. Furthermore, since the operation of the non-overlap clock signal generator according to the fifth embodiment is basically the same as the operation of the non-overlap clock signal generators according to the first and second embodiments, the description of the operation is omitted.

Figure 8:
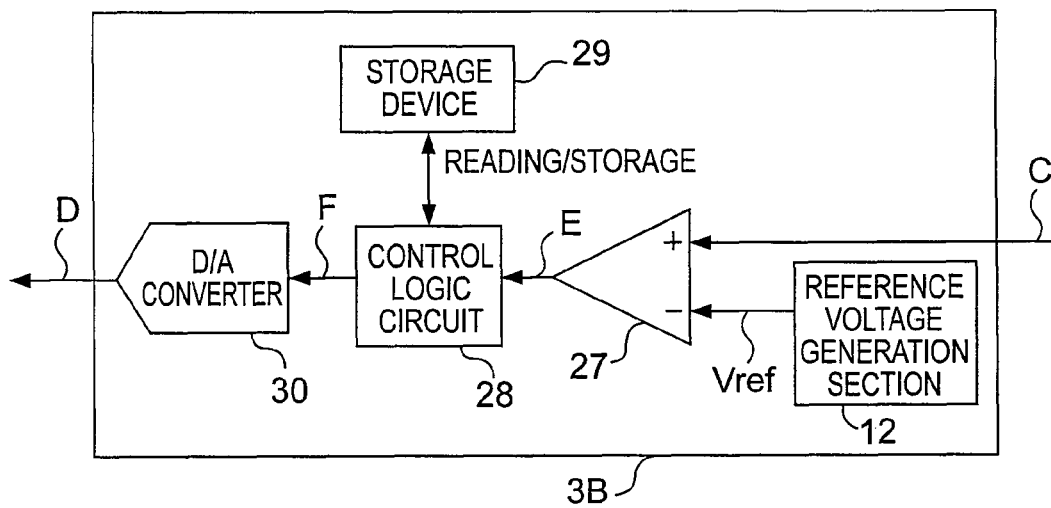
FIG. 8 is a circuit diagram showing the configuration of a control signal generation section 3B in a non-overlap clock signal generator according to a fifth embodiment of the present invention, partly shown in block shape.

FIG. 8 is a circuit diagram showing the configuration of the control signal generation section 3B in the non-overlap clock signal generator according to the fifth embodiment, partly shown in block shape. The control signal generation section 3B shown in FIG. 8 is equipped with a control logic circuit 28, a storage device 29 and a D/A converter 30 that are added to the configuration of the control signal generation section 3 described referring to FIG. 4 described above.

As shown in FIG. 8, the control signal generation section 3B in the non-overlap clock signal generator according to the fifth embodiment contains a reference voltage generation section 12 for generating the reference voltage Vref used to determine the non-overlap time to be adjusted; a comparator 27; the control logic circuit 28 that judges whether the non-overlap time is optimal and, if the non-overlap time is not optimal, searches the optimal value thereof by changing the control signal; the storage device 29 for storing the control signal value searched using the control logic circuit 28; and the D/A converter 30 for digital/analog converting the control signal value set using the control logic circuit 28 to generate the control signal D (D1 or D2 shown in FIG. 1) used to control the variable delay device 1 (1a or 1b shown in FIG. 1).

In the case that the variable delay device 1 is configured such that its delay value decreases when the voltage of the control signal D is raised, the control signal generation section 3B shown in FIG. 8 operates as described below.

The comparator 27 compares the voltage of the detection signal C from the non-overlap detector 2 with the reference voltage Vref indicating the desired non-overlap time to be set and outputs the result E of the comparison to the control logic circuit 28. For example, in the case that the actual non-overlap time at the output of the non-overlap clock signal generator is longer than the desired non-overlap time, the voltage of the detection signal C has a value higher than the reference voltage Vref, and the comparator 27 outputs an H-level signal as a comparison signal E. When the H-level comparison signal E is input, the control logic circuit 28 increments a control signal value F by 1 so that the voltage of the control signal D rises to shorten the non-overlap time. Hence, the voltage of the control signal D output from the D/A converter 30 rises, the delay amount of the variable delay device 1 decreases, and the non-overlap time becomes short. The comparator 27 here again compares the voltage of the detection signal C with the reference voltage Vref. In the case that the voltage of the detection signal C is higher than the reference voltage Vref, that is, when the comparison signal E is still an H-level signal, the control logic circuit 28 increments the control signal value F by 1 in a way similar to that described above, thereby performing operation to shorten the non-overlap time.

When the above-mentioned operation is repeated beyond a certain time point, the non-overlap time becomes shorter than the desired non-overlap time. Beyond the time point, the comparison signal E output from the comparator 27, having H level so far, is brought to have L level for the first time. The control logic circuit 28 detects that the level of the comparison signal E has been inverted, recognizes that the adjustment of the non-overlap amount is completed, and stores the control signal value F obtained at the time into the storage device 29.

The adjustment of the non-overlap amount is completed by performing the above-mentioned operation. Hereafter, the control logic circuit 28 controls the variable delay device 1 via the D/A converter 30 using the control signal value F stored in the storage device 29. It is thus not necessary to operate the non-overlap detector 2, the reference voltage generation section 12 and the comparator 27. In the case that an analog voltage is maintained, the time for the maintenance is limited within a period until the charge stored in a capacitor is not discharged. However, long-term maintenance is made possible by digitally storing the control signal D in the storage device 29.

Hence, in the case that the usage environment conditions for the clock signal generation apparatus according to the fifth embodiment, such as power supply voltage fluctuations and temperature functions, are not changed significantly, it is not necessary to activate the non-overlap detector 2 at all times and low power consumption can be attached by adjusting the non-overlap amount and by maintaining the control signal obtained at the time of the adjustment, for example, before a circuit, such as an A/D converter, serving as a load circuit that uses the non-overlap clock signals is activated (for example, when the power is turned ON).

In the case that the usage environment conditions, such as power supply voltage fluctuations and temperature functions, are changed, it is possible to periodically adjust the above-mentioned non-overlap amount on the order of several msec, for example. Furthermore, the clock signal generation apparatus can be configured so as to adjust the non-overlap amount when a change in the environment conditions, such as power supply voltage fluctuations and temperature functions, is detected.

Sixth Embodiment

Figure 9:
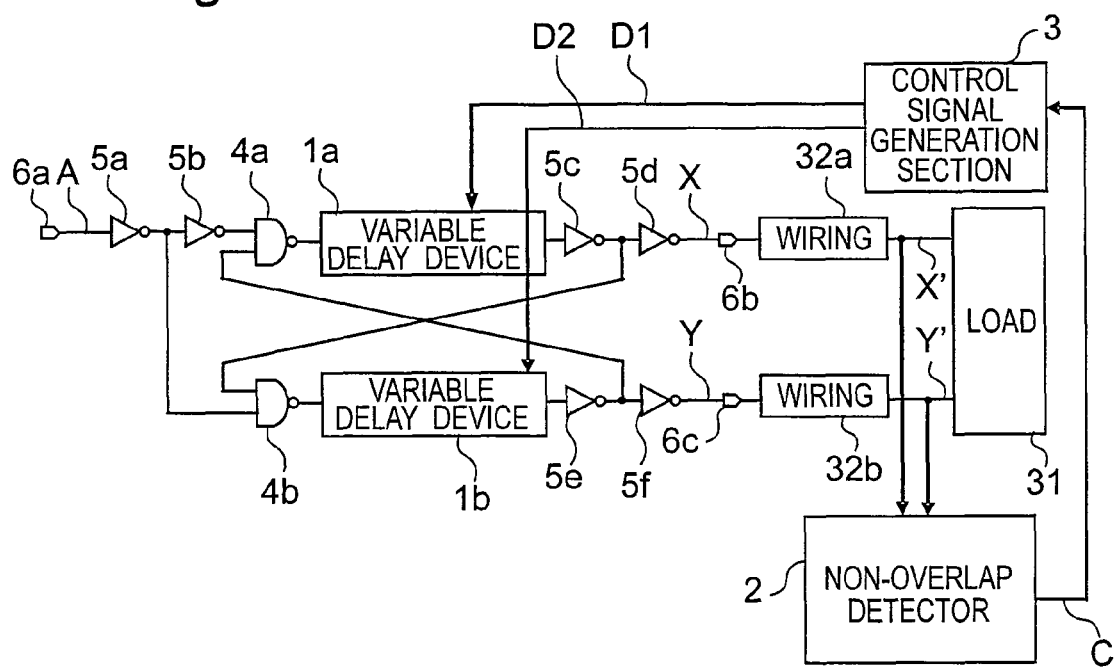
FIG. 9 is a block diagram showing the basic configuration of a non-overlap clock signal generator according to a sixth embodiment of the present invention.
Figure 11A:
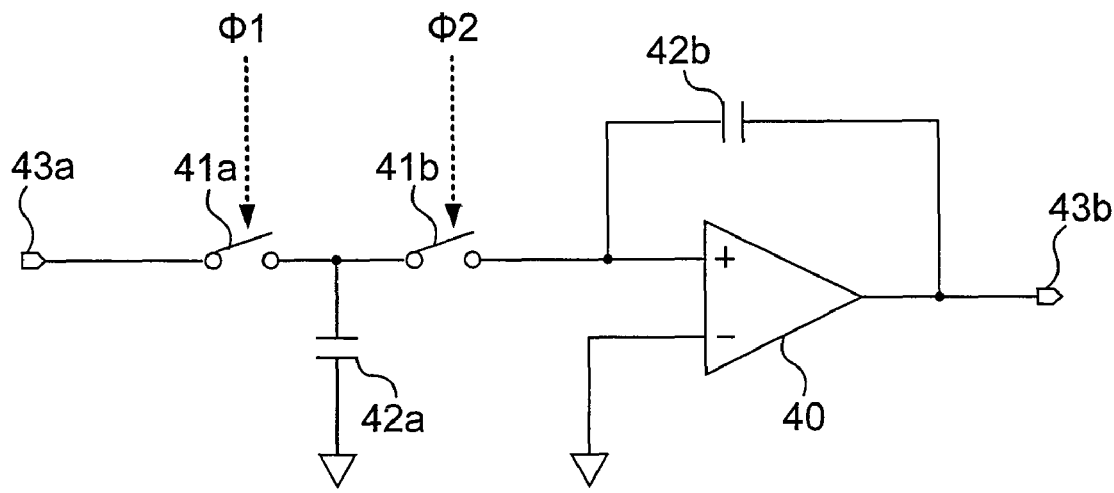
FIGS. 11A and 11B are block diagram showing the circuit configuration of switched-capacitor integrator generally used and diagrams showing the waveforms thereof.
Figure 11B:
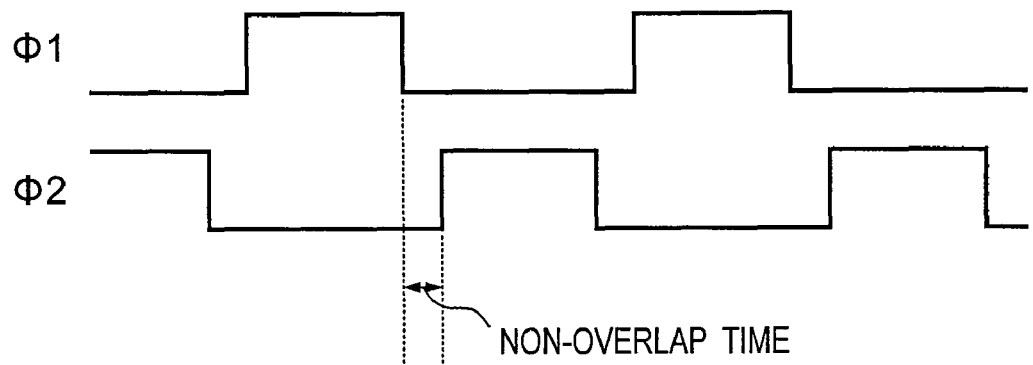
Figure 12:
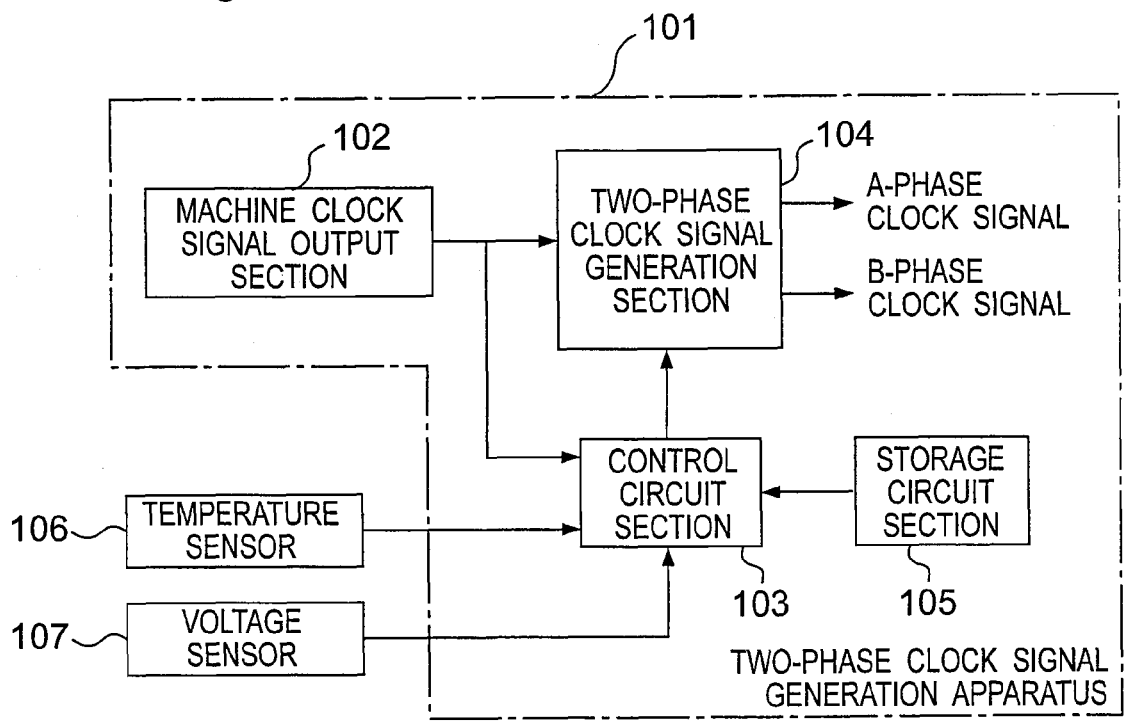
FIG. 12 is a block diagram showing the configuration of the conventional two-phase clock signal generation apparatus 101.

Next, a non-overlap clock signal generator serving as a clock signal generation apparatus according to a sixth embodiment of the present invention will be described below. FIG. 9 is a block diagram showing the basic configuration of the non-overlap clock signal generator according to the sixth embodiment. Since the operation of the non-overlap clock signal generator according to the sixth embodiment is basically the same as the operation of the non-overlap clock signal generators according to the above-mentioned first and second embodiments, its detailed description is omitted, and only differences will be described below.

Although the non-overlap clock signal generator shown in FIG. 9 has a configuration similar to that of the non-overlap clock signal generator according to the first embodiment shown in FIG. 1, the non-overlap detector 2 is disposed inside or adjacent to the load circuit 31 that uses the non-overlap clock signals. In the non-overlap clock signal generator according to the sixth embodiment, the wiring to the non-overlap detector 2 is not directly delivered from the output terminals 6b and 6c provided in the non-overlap clock signal generator. In the wiring from the output terminals 6b and 6c of the non-overlap clock signal generator to the load circuit 31 that uses the non-overlap clock signals X and Y, the non-overlap detector 2 is delivered from non-overlap clock lines for clock signals X' and Y' disposed close to the load circuit 31.

FIGS. 10A to 10E show signal waveforms in the non-overlap clock signal generator according to the sixth embodiment. FIG. 10A shows a clock signal A input to the clock signal input terminal 6a. FIG. 10B shows the non-overlap clock signal X having phase $\Phi 1$ and output from the output terminal 6b. FIG. 10C shows the non-overlap clock signal Y having phase $\Phi 2$ and output from the output terminal 6c. FIG. 10D shows the clock signal X' at the load circuit terminal of the non-overlap clock line connected to the output terminal 6b to which the clock signal X having phase $\Phi 1$ is output. FIG. 10E shows the clock signal Y' at the load circuit terminal of the non-overlap clock line connected to the output terminal 6c to which the clock signal Y having phase Φ2 is output.

Parasitic elements, such as resistance components and capacitance components, are present in the wiring itself between the output terminals 6b and 6c of the non-overlap clock signal generator and the load circuit 31. Hence, as shown in FIGS. 10D and 10E, the non-overlap amount of the clock signals X' and Y' of the non-overlap clock lines may deviate from the desired value due to delay or bluntness caused by the parasitic elements in the wiring in some cases, even if the non-overlap amount is optimal at the output terminals 6b and 6c of the non-overlap clock signal generator. As a result, the non-overlap zone may be lost and the H-level zones of the two-phase clock signals X' and Y' may overlap with each other, whereby there is a fear of causing malfunction of the load circuit 31 that uses the non-overlap clock signals. Hence, even if parasitic elements due to the wiring and the like are present, the non-overlap amount can be adjusted in consideration of the effect of the parasitic elements by detecting the non-overlap amount of the clock signals X' and Y' of the non-overlap clock lines close to the load circuit 31 that uses the non-overlap clock signals, using the non-overlap detector 2 as in the above-mentioned configuration. As a result, in the non-overlap clock signal generator according to the sixth embodiment, it is possible to prevent the load circuit 31 that uses the non-overlap clock signals from malfunctioning.

As described in the above-mentioned embodiments, the present invention has an effect of preventing malfunction of a DT analog circuit or the like by suppressing fluctuations in the non-overlap time due to temperature fluctuations, power supply voltage fluctuations, fluctuations caused by individual differences in components, parasitic resistances and parasitic capacitances in wiring, etc. and by securely obtaining an ensured non-overlap zone in the non-overlap clock signals required for operating such a DT analog circuit or the like typified by a delta-sigma A/D converter. Furthermore, since non-overlap clock signals having a long H-level zone can be obtained by optimizing the non-overlap time, the request for obtaining high operation speed of the DT analog circuit is released, whereby reduction in power consumption and circuit area can be attained in the DT analog circuit.

The present invention relates to a clock signal generation apparatus for use in discrete-time analog circuits, etc., such as an A/D converter, and provides a versatile apparatus capable of securely generating a clock signal having an optimal non-overlap amount by absorbing fluctuations due to temperature characteristics, power supply voltage characteristics and individual differences in components.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A clock signal generation apparatus comprising:
   variable delay devices for varying delay time of two-phase clock signals used in a load circuit that uses non-overlap clock signals,
   a non-overlap detector for detecting a non-overlap time in H-level zones of said two-phase clock signals and outputting a detection signal corresponding to said non-overlap time, and
   a control signal generation section for generating a control signal that is used to control said variable delay devices on the basis of the detection signal from said non-overlap detector,
   wherein said non-overlap detector comprises a logic circuit for comparing said two-phase clock signals input and an integrator for integrating the output of said logic circuit.

2. The clock signal generation apparatus according to claim 1, wherein said non-overlap detector is disposed inside a load circuit that uses the non-overlap clock signals or directly connected to the input terminals of said load circuit.

3. The clock signal generation apparatus according to claim 1, wherein said control signal generation section comprises a reference voltage generation section for generating a reference signal corresponding to a predetermined non-overlap time, and a comparator for comparing the detection signal from said non-overlap detector with said reference signal and outputting the control signal.

4. The clock signal generation apparatus according to claim 3, wherein said variable delay devices have a logic element section for determining the non-overlap time in the H-level zones of said two-phase clock signals, and
   the delay amount of said logic element section is adjusted and said non-overlap time is determined by controlling the power supply voltage or the back-gate voltage of said logic element section using the control signal.

5. The clock signal generation apparatus according to claim 3, wherein said non-overlap detector has a detection voltage maintaining circuit for maintaining the detection signal corresponding to the non-overlap time detected, and said control signal generation section is configured so as to generate the control signal on the basis of the detection signal maintained in said detection voltage maintaining circuit.

6. The clock signal generation apparatus according to claim 3, wherein said control signal generation section has a control voltage maintaining circuit for maintaining the control signal generated, and said variable delay devices change the delay time of said two-phase clock signals depending on the control signal maintained in said control voltage maintaining circuit.

7. The clock signal generation apparatus according to claim 3, wherein said control signal generation section comprises a control logic circuit for digitally comparing the non-overlap time based on the detection signal from said non-overlap detector with a preset predetermined value and generating the desired control signal value on the basis of the result of the comparison; a storage device for storing the desired control signal value generated in said control logic circuit as a digital value; and a D/A converter for converting the desired control signal value into an analog value.

8. The clock signal generation apparatus according to claim 3, wherein said non-overlap detector is disposed inside a load circuit that uses the non-overlap clock signals or directly connected to the input terminals of said load circuit.

9. The clock signal generation apparatus according to claim 1, wherein said variable delay devices have a logic element section for determining the non-overlap time in the H-level zones of said two-phase clock signals, and
   the delay amount of said logic element section is adjusted and said non-overlap time is determined by controlling the power supply voltage or the back-gate voltage of said logic element section using the control signal.

10. The clock signal generation apparatus according to claim 1, wherein said non-overlap detector has a detection voltage maintaining circuit for maintaining the detection signal corresponding to the non-overlap time detected, and said control signal generation section is configured so as to generate the control signal on the basis of the detection signal maintained in said detection voltage maintaining circuit.

11. The clock signal generation apparatus according to claim 1, wherein said control signal generation section has a control voltage maintaining circuit for maintaining the control signal generated, and said variable delay devices change the delay time of said two-phase clock signals depending on the control signal maintained in said control voltage maintaining circuit.

12. The clock signal generation apparatus according to claim 1, wherein said control signal generation section comprises a control logic circuit for digitally comparing the non-overlap time based on the detection signal from said non-overlap detector with a preset predetermined value and generating the desired control signal value on the basis of the result of the comparison; a storage device for storing the desired control signal value generated in said control logic circuit as a digital value; and a D/A converter for converting the desired control signal value into an analog value.

13. The clock signal generation apparatus according to claim 1, wherein said non-overlap detector is disposed inside a load circuit that uses the non-overlap clock signals or directly connected to the input terminals of said load circuit.

14. A clock signal generation apparatus comprising:
variable delay devices for varying delay time of two-phase clock signals used in a load circuit that uses non-overlap clock signals,
a non-overlap detector for detecting a non-overlap time in H-level zones of said two-phase clock signals and outputting a detection signal corresponding to said non-overlap time, and
a control signal generation section for generating a control signal that is used to control said variable delay devices on the basis of the detection signal from said non-overlap detector,
wherein said control signal generation section comprises a reference voltage generation section for generating a reference signal corresponding to a predetermined non-overlap time, and a comparator for comparing the detection signal from said non-overlap detector with said reference signal and outputting the control signal.

15. A clock signal generation apparatus comprising:
variable delay devices for varying delay time of two-phase clock signals used in a load circuit that uses non-overlap clock signals,
a non-overlap detector for detecting a non-overlap time in H-level zones of said two-phase clock signals and outputting a detection signal corresponding to said non-overlap time, and
a control signal generation section for generating a control signal that is used to control said variable delay devices on the basis of the detection signal from said non-overlap detector,
wherein said variable delay devices have a logic element section for determining the non-overlap time in the H-level zones of said two-phase clock signals, and
the delay amount of said logic element section is adjusted and said non-overlap time is determined by controlling the power supply voltage or the back-gate voltage of said logic element section using the control signal.

16. A clock signal generation apparatus comprising:
variable delay devices for varying delay time of two-phase clock signals used in a load circuit that uses non-overlap clock signals,
a non-overlap detector for detecting a non-overlap time in H-level zones of said two-phase clock signals and outputting a detection signal corresponding to said non-overlap time, and
a control signal generation section for generating a control signal that is used to control said variable delay devices on the basis of the detection signal from said non-overlap detector,
wherein said non-overlap detector has a detection voltage maintaining circuit for maintaining the detection signal corresponding to the non-overlap time detected, and said control signal generation section is configured so as to generate the control signal on the basis of the detection signal maintained in said detection voltage maintaining circuit.

17. A clock signal generation apparatus comprising:
variable delay devices for varying delay time of two-phase clock signals used in a load circuit that uses non-overlap clock signals,
a non-overlap detector for detecting a non-overlap time in H-level zones of said two-phase clock signals and outputting a detection signal corresponding to said non-overlap time, and
a control signal generation section for generating a control signal that is used to control said variable delay devices on the basis of the detection signal from said non-overlap detector,
wherein said control signal generation section has a control voltage maintaining circuit for maintaining the control signal generated, and said variable delay devices change the delay time of said two-phase clock signals depending on the control signal maintained in said control voltage maintaining circuit.

18. A clock signal generation apparatus comprising:
variable delay devices for varying delay time of two-phase clock signals used in a load circuit that uses non-overlap clock signals,
a non-overlap detector for detecting a non-overlap time in H-level zones of said two-phase clock signals and outputting a detection signal corresponding to said non-overlap time, and
a control signal generation section for generating a control signal that is used to control said variable delay devices on the basis of the detection signal from said non-overlap detector,
wherein said control signal generation section comprises a control logic circuit for digitally comparing the non-overlap time based on the detection signal from said non-overlap detector with a preset predetermined value and generating the desired control signal value on the basis of the result of the comparison; a storage device for storing the desired control signal value generated in said control logic circuit as a digital value; and a D/A converter for converting the desired control signal value into an analog value.

* * * * *